(12) United States Patent
Tomita

(10) Patent No.: US 6,376,869 B1
(45) Date of Patent: Apr. 23, 2002

(54) SEMICONDUCTOR DEVICE

(75) Inventor: Hiroyoshi Tomita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/385,013

(22) Filed: Aug. 27, 1999

(30) Foreign Application Priority Data

Nov. 19, 1998 (JP) .......................................... 10-329907

(51) Int. Cl.$^7$ .............................................. H01L 29/72
(52) U.S. Cl. ...................... 257/288; 257/296; 257/298; 257/379; 257/532; 326/83; 326/93; 326/103; 365/185.1
(58) Field of Search ................................ 257/288, 296, 257/298, 379, 532; 326/83, 93, 103; 365/185

(56) References Cited

U.S. PATENT DOCUMENTS 6,018,256 A * 1/2000 Kumagai et al. ........... 257/288

* cited by examiner

*Primary Examiner*—Edward Wojciechowicz
(74) *Attorney, Agent, or Firm*—Arent Fox Kintner Plotkin, Kahn, PLLC

(57) ABSTRACT

A semiconductor device includes a first terminal for inputting and outputting data and a second terminal for inputting control data in synchronization with a strobe signal. The semiconductor device includes an equivalent circuit which is provided in the second terminal. Further, the equivalent circuit has a capacitance which is equivalent to that in an output circuit which is provided in the first terminal.

8 Claims, 12 Drawing Sheets

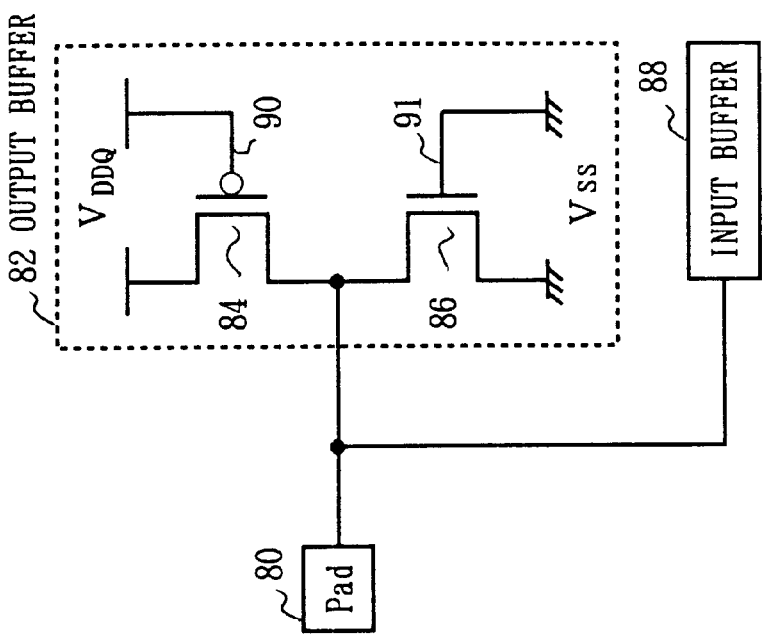
FIG. 6B (DM TERMINAL)
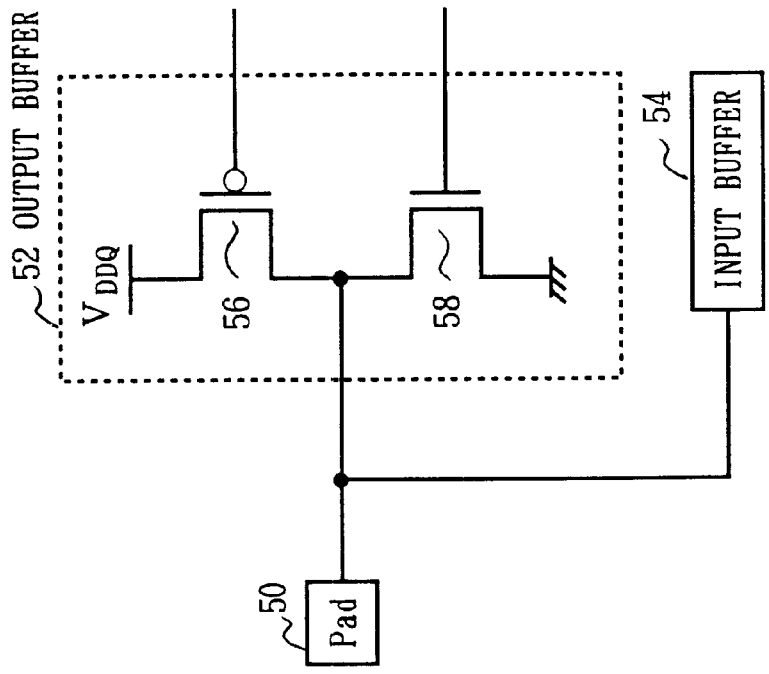
FIG. 6A (DQS TERMINAL/DQ TERMINAL)

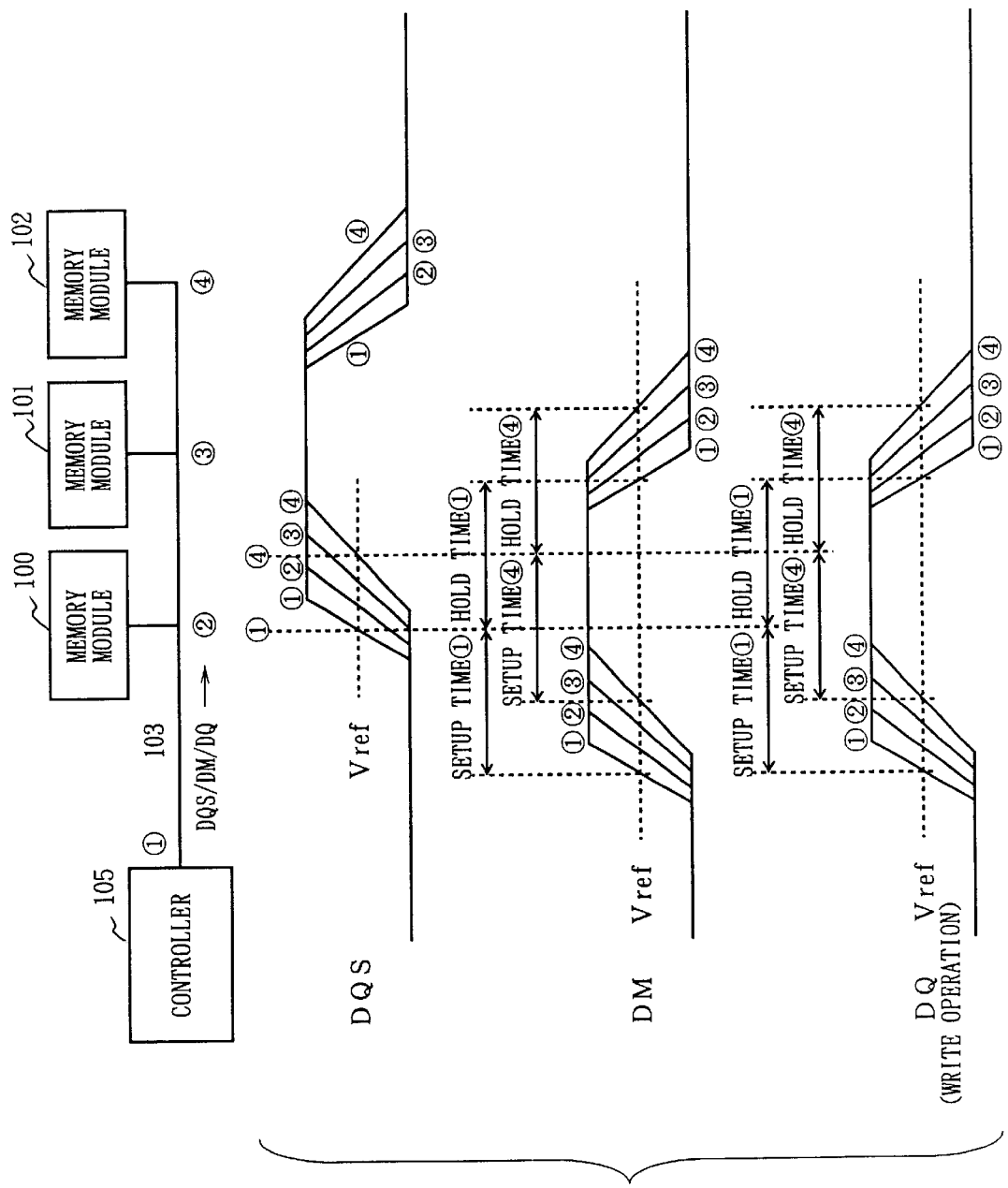

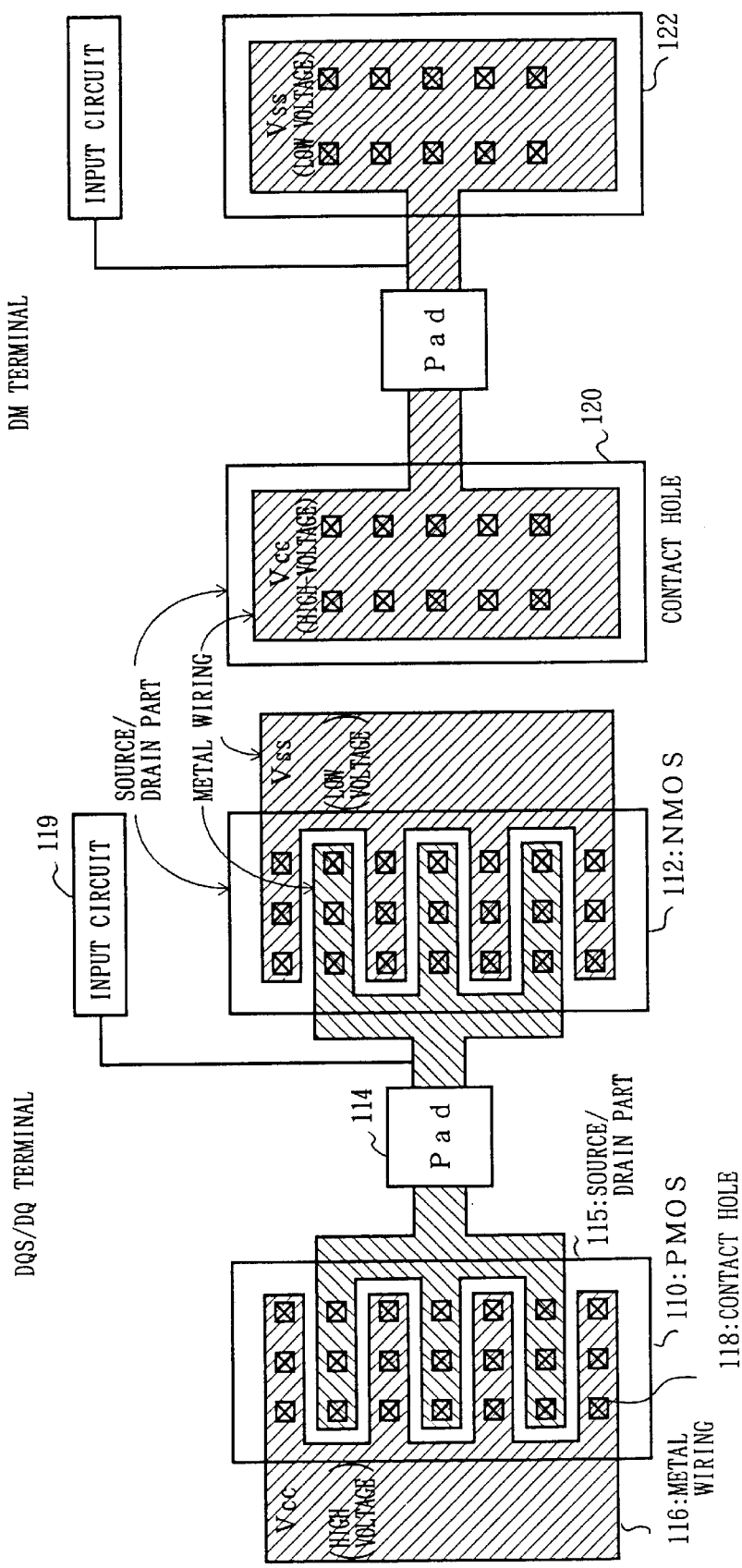

SEMICONDUCTOR DEVICE

BACKGROUND OF THE INVENTION

1. Field of the Invention

The present invention generally relates to a semiconductor device. More particularly, the present invention relates to a semiconductor device which captures data in synchronization with a strobe signal.

2. Description of the Related Art

FIG. 1 shows a configuration example of a semiconductor device according to a conventional technique. Specifically, FIG. 1 shows a configuration of a memory system which uses, for example, an SDRAM (Synchronous Dynamic Random Access Memory) as a memory module, and is controlled by a controller. In addition, the memory system operates in synchronization with a clock signal. As shown in the figure, a plurality of memory modules 10, 11, . . . are connected to the controller 30 by bus lines such as a command bus 21, a data strobe (DQS) bus 22, a data mask (DM) bus 23, a data (DQ) bus 24 and a clock bus 25. Additionally, a clock source 40 supplies a clock signal to the controller 30. The memory module is a single memory chip or a plurality of memory chips. In this configuration, a data read/write operation is carried out in synchronization with a rising edge or a falling edge of the clock signal which is supplied from the clock source 40. This method is called DDR (Double Data Rate).

FIG. 2 is a timing chart showing a write operation of the above-mentioned memory system. A write command is fixed at the rising edge of the clock signal CLK (point A). Then, the controller 30 outputs the data strobe signal DQS, the data mask signal DM and the data signal DQ to each memory module in synchronization with the clock signal CLK. Each memory module captures the data mask signal DM and the data signal DQ at the rising edge and the falling edge of the data strobe signal DQS. When a high-level data mask signal DM is captured at the rising edge or the falling edge of the data strobe signal DQS, a corresponding data signal DQ, being shown as (D2) in FIG. 2, is masked.

FIG. 3 is a timing chart showing a read operation. A read command is fixed at the rising edge of the clock signal CLK (point B). Then, each memory module outputs the data strobe signal DQS, and the data signal DQ to the controller 30 in synchronization with the clock signal CLK. The controller 30 captures the data signal DQ in synchronization with a signal delayed from the rising edge and the falling edge of the data strobe signal DQS.

As mentioned above, the memory system uses the data strobe (DQS) bus 22 bidirectionally such that the sending directions of the data strobe signal DQS and the data signal DQ are the same. In addition, the memory system is configured such that lengths of each bus line between the controller 30 and each memory module are the same. Thus, skew in signals which are exchanged between each memory module and the controller 30 at the time of the data read/write operation is reduced.

The data strobe signal DQS and the data signal DQ are sent bidirectionally between the controller 30 and the memory module according to a read/write operation mode. On the other hand, the data mask signal DM is sent from the controller 30 to each memory module only at the time of the write operation. Therefore, each of a DQS terminal and a DQ terminal in the memory module functions as an input/output circuit, and the DM terminal functions as an input circuit.

FIG. 4A is a diagram showing an example of the DQS terminal or the DQ terminal (represented as DQS/DQ terminal hereinafter) in the conventional memory module. FIG. 4B is a diagram showing an example of the DM terminal in the conventional memory module. As shown in FIG. 4A, each of the DQS/DQ terminal includes a pad 50, an output buffer 52 and an input buffer 54. The DQS/DQ terminal is connected to the above-mentioned bus line through the pad 50, and the output buffer 52 and the input buffer 54 are connected in parallel. The output buffer 52 is configured by a PMOS (P-channel Metal Oxide Semiconductor) transistor 56 and an NMOS (N-channel Metal Oxide Semiconductor) transistor 58. As shown in FIG. 4B, the DM terminal includes a pad 60 and an input buffer 62. The DM terminal is connected to the bus line through the pad 60. Accordingly, the terminal capacity of the DM terminal is less than the terminal capacity of the DQS/DQ terminal at the time of the write operation, that is, when data is input to the memory module.

However, since the terminal capacity of the DM terminal is different from that of the DQS/DQ terminal, there is the following problem. The problem will be described with reference to FIGS. 5A and 5B. FIG. 5A shows a conventional memory system and FIG. 5B shows signal waveforms of signals in the configuration.

As shown in FIG. 5A, each of memory modules 70–72 is connected to a controller 75 by a bus lines 73. In addition, the memory system is connected to a clock source, which is not shown in the figure. The controller 75 outputs a data strobe signal DQS (a DQS signal), a data signal DO (a DO signal) and a data mask signal DM (a DM signal) at the time of write operation in synchronization with a clock signal CLK (a CLK signal). These signals are sent to the memory modules through the bus lines. FIG. 5B shows the waveforms in the configuration at the time of the write operation. Signals of DQS, DM and DQ travel from the controller 75 to the memory modules 70–72. The reference number of each waveform in FIG. 5B corresponds to the reference number in FIG. 5A. For example, a DOS signal at a point 1 in FIG. 5A takes a DQS waveform indicated by 1 in FIG. 5B. In FIG. 5B, $V_{ref}$ represents a reference voltage.

As shown in FIG. 5B, the difference between the slopes of the rising/falling edge of the signals is small, at the point 1 in FIG. 5A. At this time, the setup time 1 is equal to the hold time 1 for both of the DQ signal and the DM signal. The setup time 1 means the setup time at the point 1. It is the same for other points.

As mentioned before, the terminal capacity of the DQS/DQ terminal in each memory module is larger than that of the DM terminal. Thus, as a signal travels from the point 1 to the point 4, the rising/falling edge of the DQS/DQ signal gradually becomes gentler than the rising/falling edge of the DM signal. The difference is apparent by comparing a waveform of the DQS/DQ signal at the point 4 with a waveform of the DM signal at the point 4.

Since the slope of the rising/falling edge of the DQ signal is the same as that of the DQS signal at the point 4, the setup time and the hold time can be kept adequately for the DQ signal, that is, the setup time 4 is equal to the hold time 4. On the other hand, the slope of the rising/falling edge of the DM signal is steeper than that of the DQS signal. Therefore, the hold time becomes shorter than the setup time for the DM signal as shown in the waveform, that is, setup time 4>hold time 4. As a result, an adequate margin can not be kept for the hold time, thereby a stable operation becomes difficult when carrying out high-speed access.

Therefore, according to the conventional technique, there is a problem that a timing margin for data input at the time of the write operation can not be kept adequately, since the terminal capacity of the DM terminal is different from that of the DQS/DQ terminal.

SUMMARY OF THE INVENTION

It is an object of the present invention to provide a semiconductor device and a system including the semiconductor device which can keep an adequate timing margin for data input at the time of a write operation, the semiconductor device inputting/outputting data in synchronization with a strobe signal.

The above object of the present invention is achieved by a semiconductor device which includes a first terminal for inputting and outputting data and a second terminal for inputting control data in synchronization with a strobe signal, the semiconductor device including:

an equivalent circuit which is provided in the second terminal, having a capacitance which is equivalent to that in an output circuit which is provided in the first terminal.

According to the above invention, the terminals are configured such that the capacity and other characteristics are the same. Therefore, the timing margin is improved, and it becomes possible to provide a semiconductor device which can operate at a higher speed.

BRIEF DESCRIPTION OF THE DRAWINGS

Other objects, features and advantages of the present invention will become more apparent from the following detailed description when read in conjunction with the accompanying drawings, in which:

FIG. 6A is a diagram showing an example of a DQS terminal or a DO terminal of the semiconductor device according to the present invention;

FIG. 6B is a diagram showing an example of a DM terminal of the semiconductor device according to the present invention;

FIG. 7A shows a memory system according to the present invention;

FIG. 7B shows signal waveforms of DQS/DM/DQ signals according to the present invention;

FIG. 8A shows a layout of the DOS/DQ terminal according to an embodiment of the present invention;

FIG. 8B shows a layout of the DM terminal according to the embodiment of the present invention;

DETAILED DESCRIPTION OF THE PREFERRED EMBODIMENTS

Figure 1:
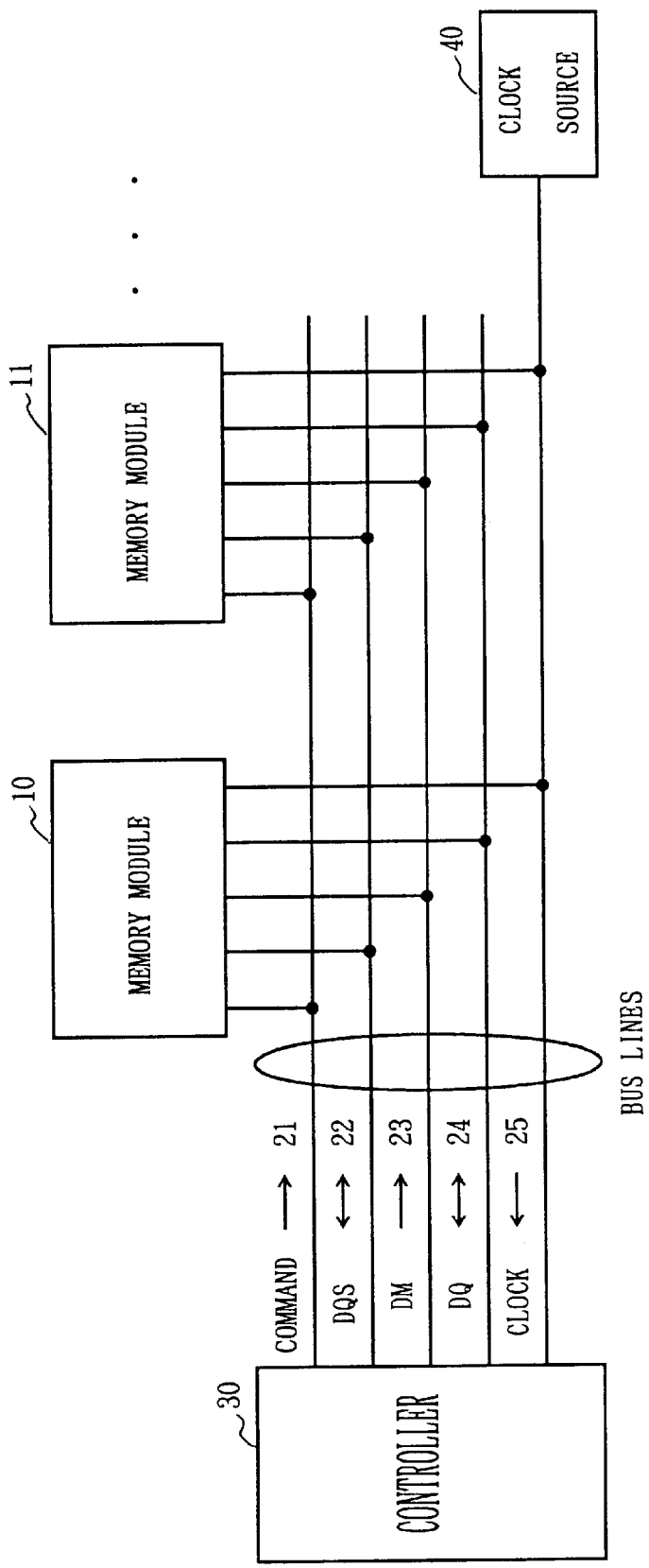
FIG. 1 is a block diagram of a configuration example of a semiconductor device according to a conventional technique.
Figure 2:
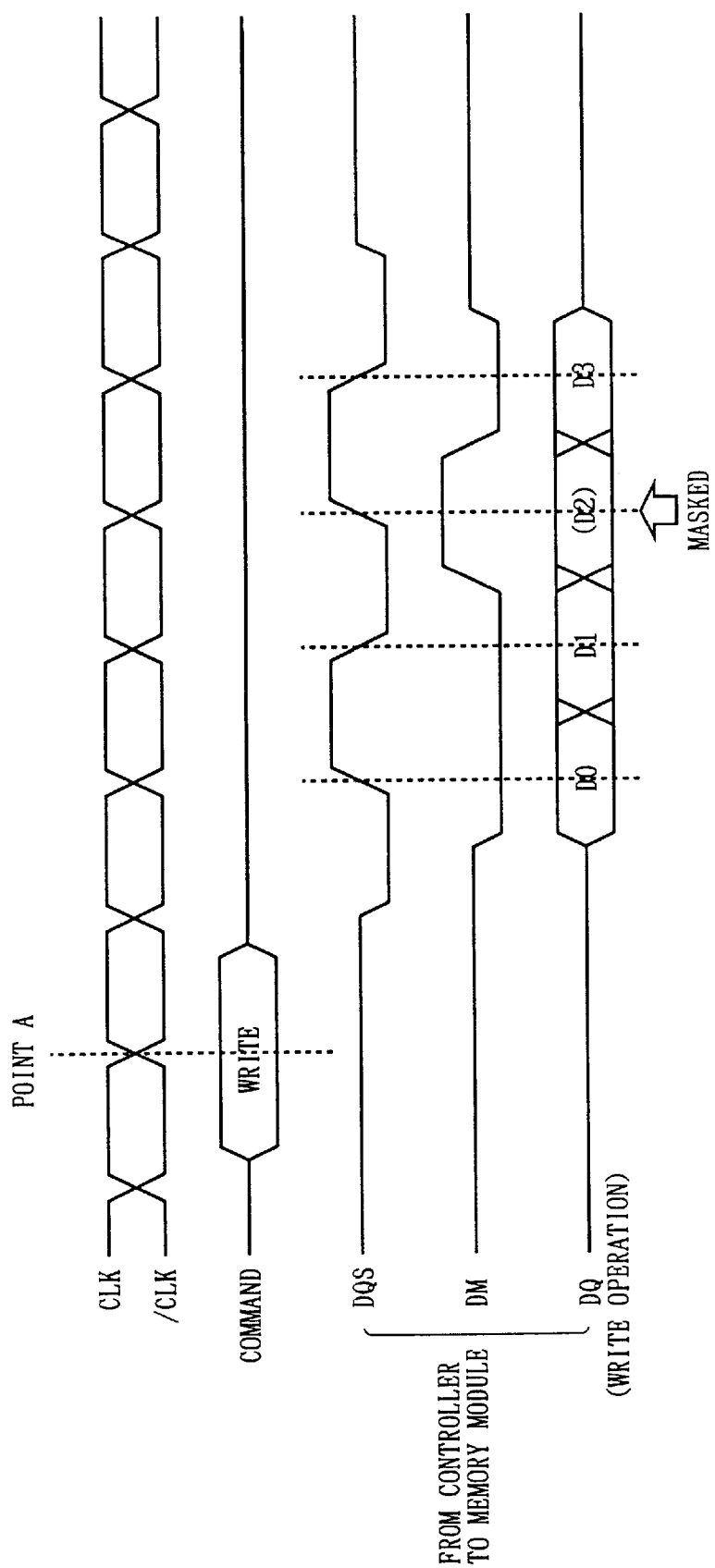
FIG. 2 is a timing chart showing a write operation of the semiconductor device according to the conventional technique.
Figure 3:
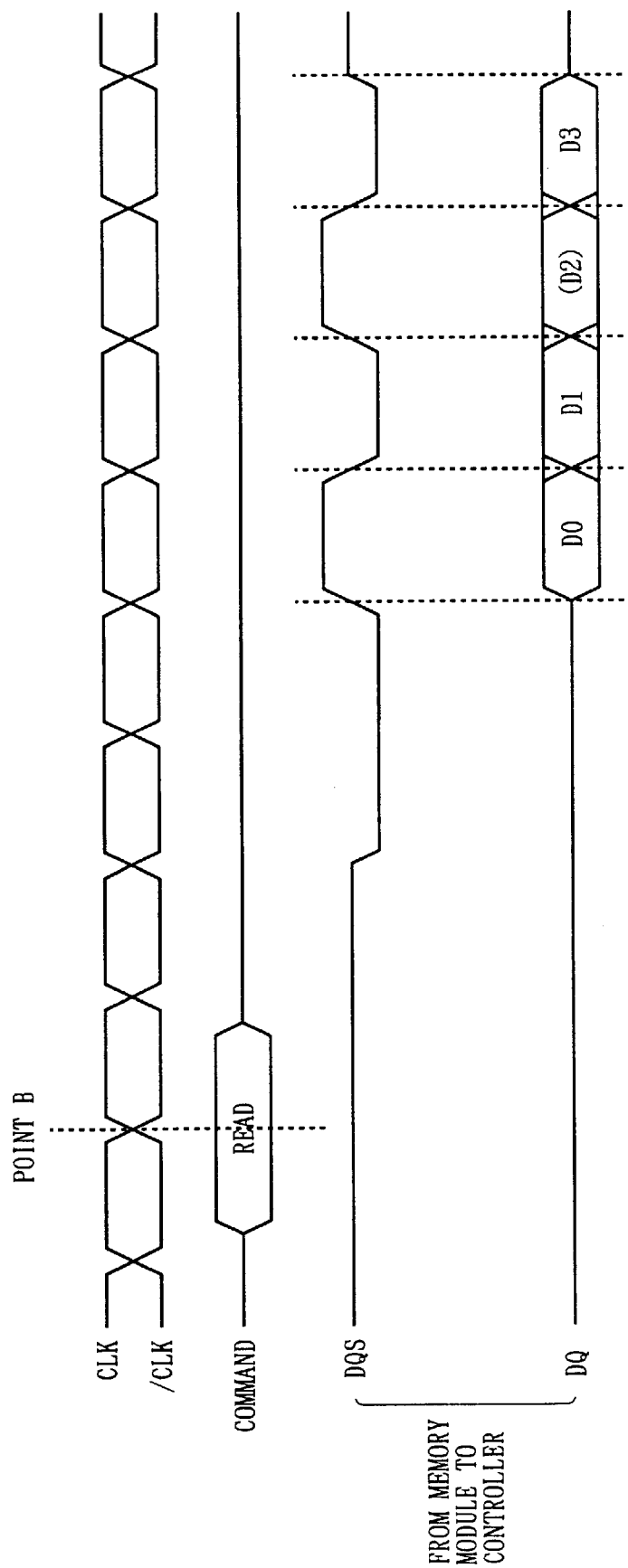
FIG. 3 is a timing chart showing a read operation of the semiconductor device according to the conventional technique.

FIG. 6A is a block diagram showing the DQS/DQ terminal according to the present invention. The configuration is the same as that of the conventional DQS/DQ terminal. FIG. 6B is a block diagram of the DM terminal according to a first embodiment of the present invention. The DM terminal includes a pad 80, an output buffer 82 and an input buffer 88. The DM terminal is connected to the above-mentioned bus-line through the pad 80, and the output buffer 82 and the input buffer 88 are connected in parallel. The output buffer 82 is configured by a PMOS (P-channel Metal Oxide semiconductor) transistor 84 and an NMOS (N-channel Metal Oxide Semiconductor) transistor 86. Basically, the configuration of the DM terminal is the same as that of the DQS/DQ terminal. A difference is that the DM terminal is configured such that the output keeps a high-impedance state. That is, a gate 90 of the PMOS transistor 84 in the output buffer 82 is connected to a $V_{DDQ}$ (source) terminal, and a gate terminal 91 of the NMOS transistor 86 is connected to a $V_{SS}$ (ground) terminal. Accordingly, the terminal capacities of the DM, DQS and DQ terminals become the same. The output buffer 82 of the DM terminal can be used as an ESD protection element.

FIG. 7A shows a memory system and FIG. 7B shows signal waveforms of signals in the configuration according to the present invention. The memory system includes memory modules which have the above-mentioned DM terminal of the present invention.

Figure 5A:
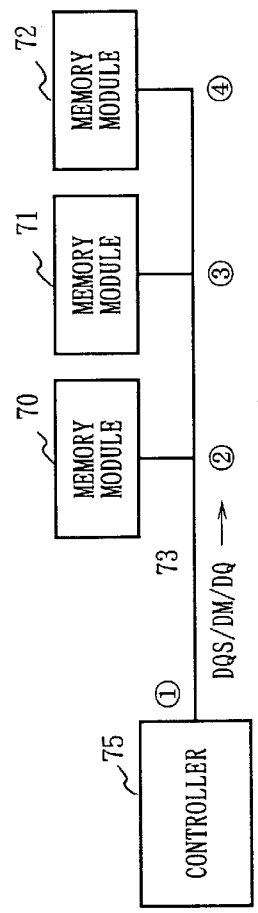
FIG. 5A shows a conventional memory system.
Figure 5B:
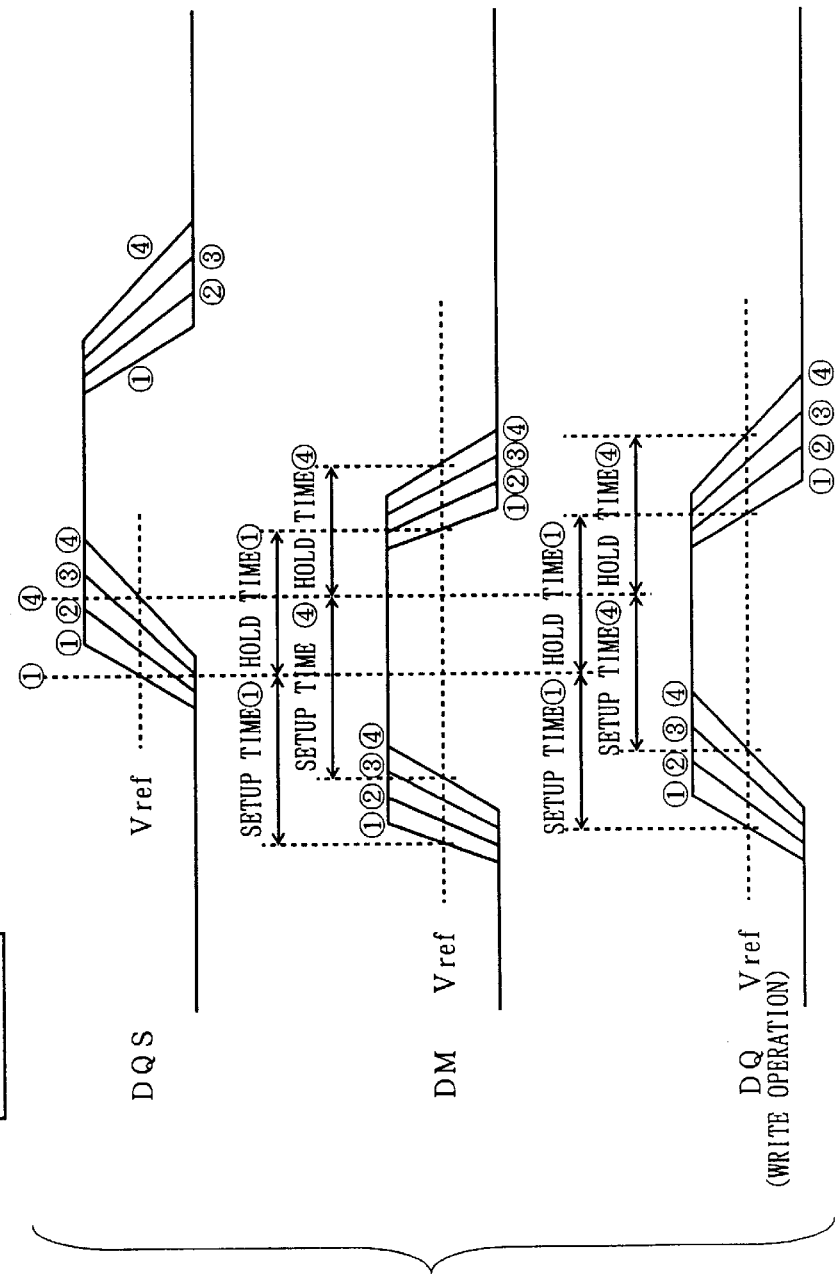
FIG. 5B shows signal waveforms of DQS/DM/DQ signals according to the conventional technique.

As shown in FIG. 7A, each of the memory modules 100–102 is connected to a controller 105 by bus lines 103. In addition, the memory system is connected to a clock source, which is not shown in the figure. The controller 105 outputs the DQS signal, the DQ signal and the DM signal at the time of a write operation in synchronization with a clock signal. These signals are sent to the memory modules through the bus lines. FIG. 7B shows the waveforms in the configuration at the time of the write operation. Signals of DQS, DM and DQ travel from the controller 105 to the memory modules 100–102. Reference numbers in FIGS. 7A and 7B are used in the same way as in FIGS. 5A and 5B.

As shown in FIG. 7B, the slopes of the rising/falling edge of the DQS, DQ and DM signals are the same at any point (1–4). Therefore, in the waveform of the DM signal at the point 4, since the setup time 4 becomes equal to the hold time 4, the setup time and the hold time can be kept adequately. Hence, the timing margin of data input is improved.

Figure 4B:
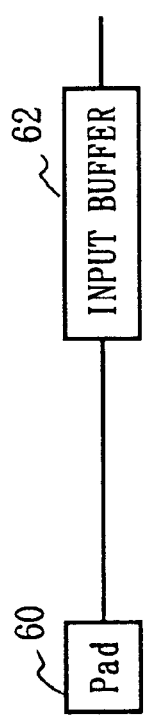
FIG. 4B is a diagram showing an example of a DM terminal of the semiconductor device according to the conventional technique.
Figure 4A:
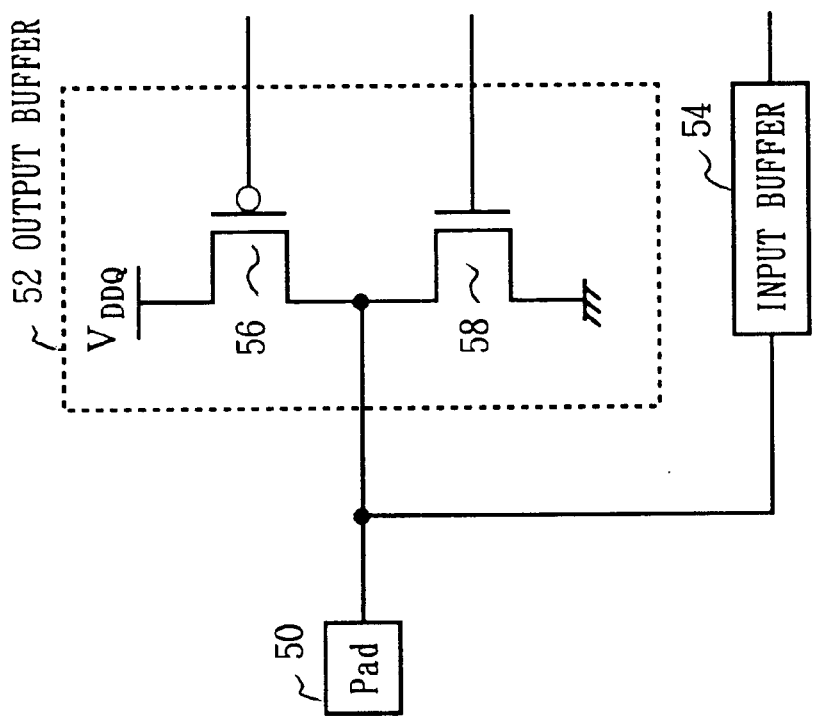
FIG. 4A is a diagram showing an example of a DQS terminal or a DO terminal of the semiconductor device according to the conventional technique.
Figure 8C:
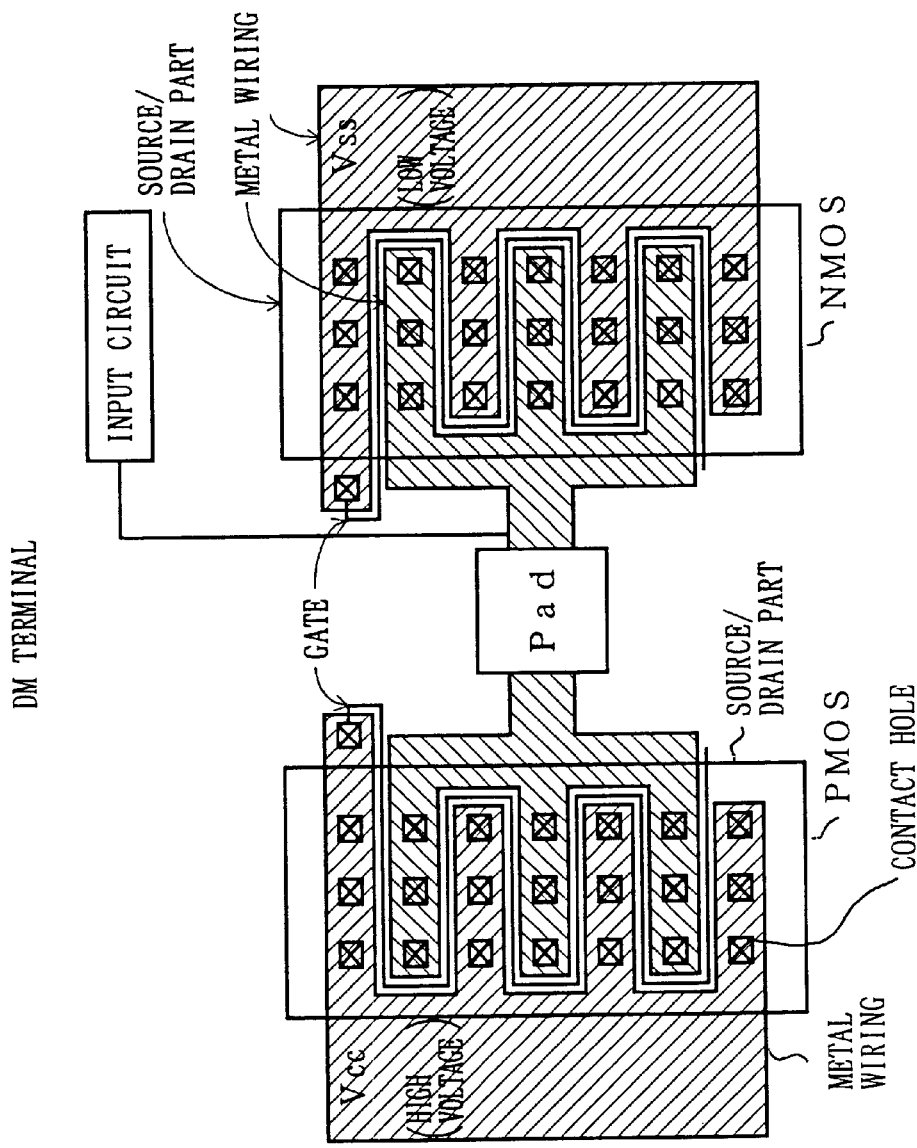
FIG. 8C shows another example of the layout of the DM terminal according to the embodiment of the present invention.
Figure 9:
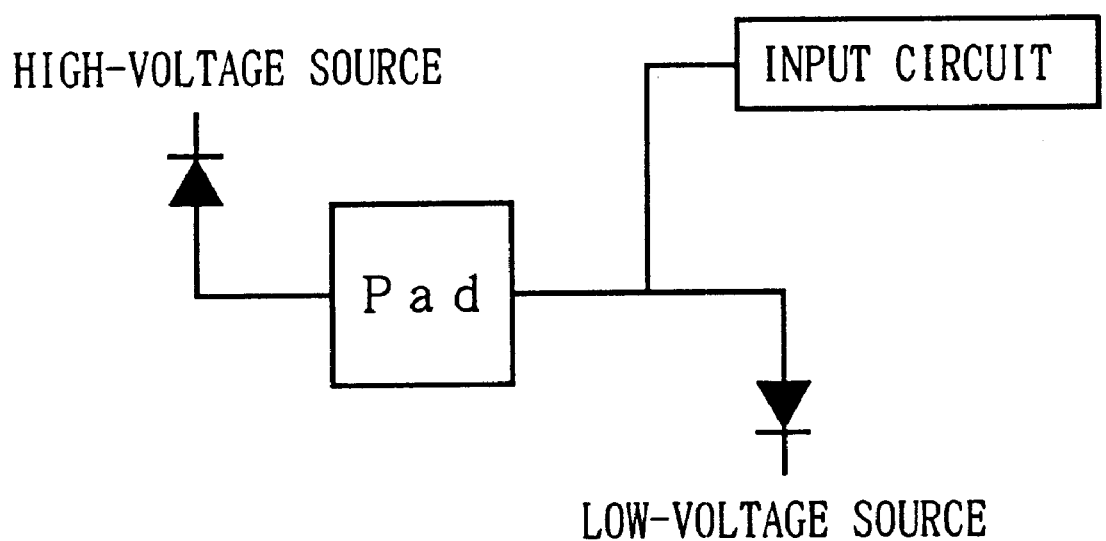
FIG. 9 is a block diagram of a circuit equivalent to the DM terminal shown in FIG. 8.

FIG. 8A shows a layout of the DQS/DQ terminal according to the present invention. FIG. 8B shows a layout of the DM terminal according to a second embodiment of the present invention. The layout shown in FIG. 8A corresponds to the circuit diagram shown in FIG. 4 or FIG. 6A. The configuration shown in FIG. 8B is equivalent to a circuit shown in FIG. 9. In addition, the layout shown in FIG. 8c corresponds to the circuit diagram shown in FIG. 6B.

In FIG. 8A, the right side of the pad 114 forms the NMOS transistor, and the left side of the pad 114 forms the PMOS transistor. In the following, the left side will be described as an example. A metal wiring 116 (the diagonally shaded area) is applied on a source/drain part 115. In addition, contact holes 118 are provided for junction. The right side has the same configuration. An input circuit 119 is connected to the metal wiring as shown in FIG. 8A.

In FIG. 8B, the source/drain parts 120 and 122 of the DM terminal are configured by elements equivalent to elements of the source/drain part of the DQS/DQ terminal. In FIG. 8B, the area of the source/drain equivalent parts 120 and 122 is the same as the area of the source/drain part of the DQS/DQ terminal shown in FIG. 8A. In other words, the junction areas are the same. Thus, the capacity and other characteristics become the same between the DQS/DQ terminal and the DM terminal. Therefore, the configuration of the second embodiment can also produce the waveform shown in FIG. 7B such that an adequate time margin can be obtained.

In the embodiments of the present invention, a circuit which includes an element equivalent, in terms of the capacity and other characteristics, to an element forming the data output circuit in the DQS/DQ terminal is connected to the DM terminal. If an element, in which only the capacity is the same and the frequency and the voltage dependence are different, is connected to the DM terminal, the above-mentioned effect of the present invention can not be obtained under actual operating conditions. Therefore, according to the present invention, the transistor element equivalent to the DQS/DQ terminal or the element which has the same junction area are connected to the DM terminal such that the frequency, the voltage (bias) dependence and the like as well as the capacity becomes the same. Therefore, a source voltage of a transistor of the DQS/DQ terminal is the same as a source voltage of the equivalent element of the DM terminal.

Figure 10:
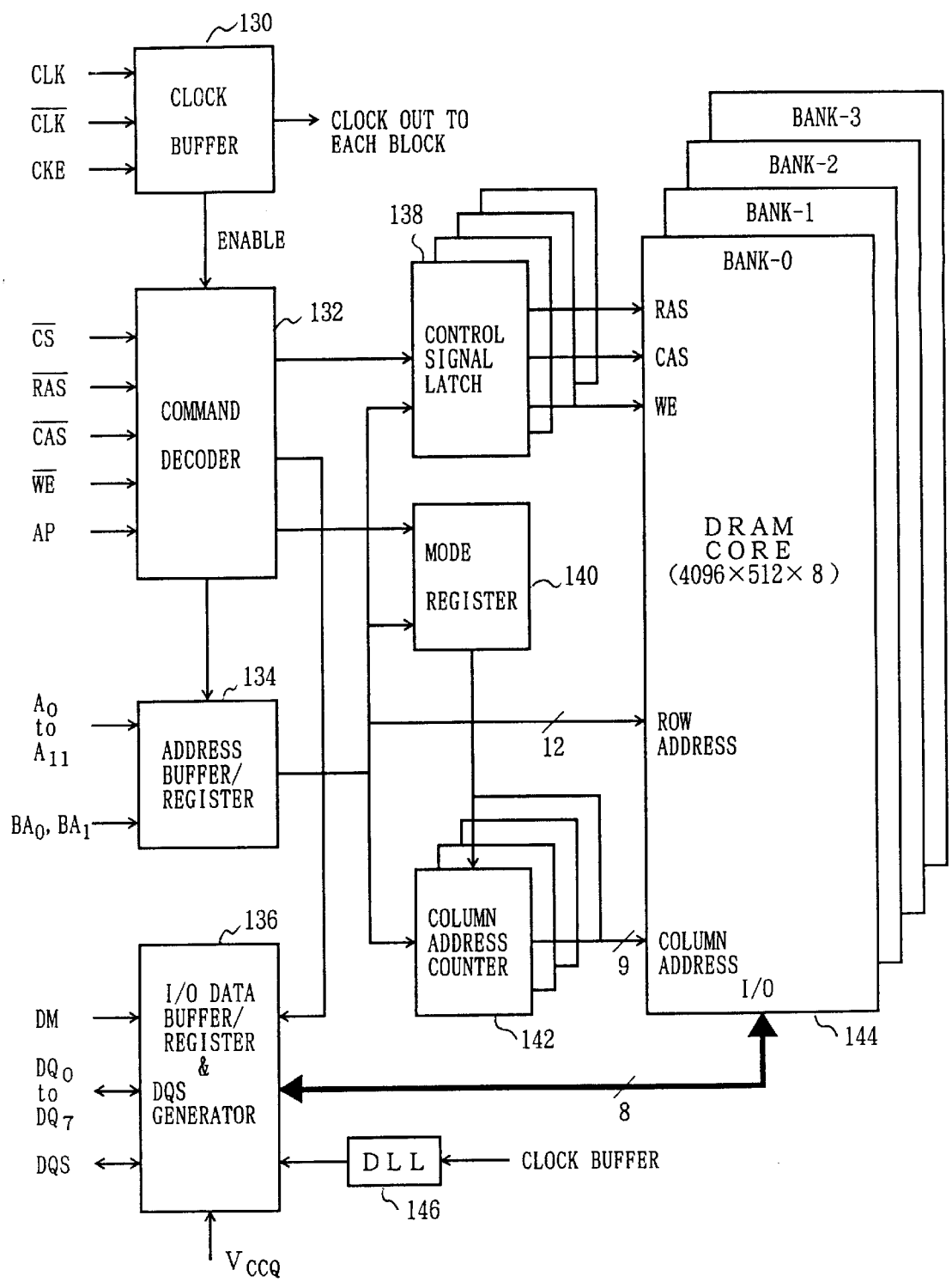
FIG. 10 is a block diagram of an SDRAM chip according to an embodiment of the present invention.

FIG. 10 is a block diagram of an SDRAM chip which has the above-mentioned terminals according to an embodiment of the present invention. The SDRAM can be used as the memory module shown in FIG. 1. As shown in FIG. 10, the SDRAM includes a clock buffer 130 for receiving a clock, a command decoder 132 for receiving a command and decoding it, an address buffer/register 134 for receiving an address, an I/O data buffer/register & DQS generator 136 for inputting/outputting data, a control signal latch 138, a mode register 140 for setting an operation mode, a column address counter 142, a DRAM core 144 and a DLL 146. The SDRAM is a four bank configuration, each bank being a 2M word×8 bit configuration. The above-mentioned terminals are included in the I/O data buffer/register 136. An operation of the SDRAM chip on the whole is basically the same as the operation of a conventional SDRAM except for the improved timing margin.

Figure 11:
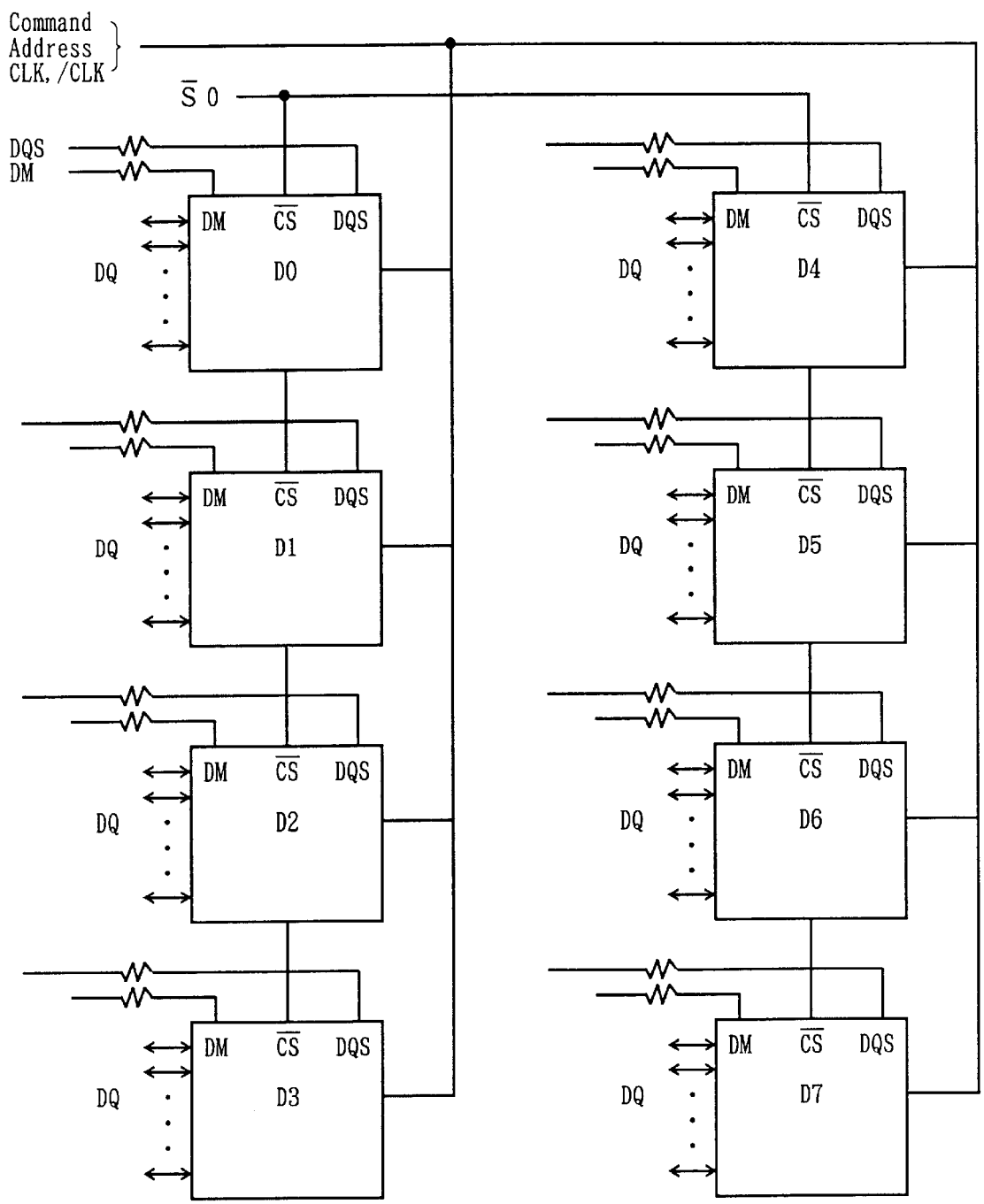
FIG. 11 is a block diagram of an example of a memory module which is configured by a plurality of SDRAM chips according to an embodiment of the present invention.

FIG. 11 is a block diagram of an example of the memory module which is configured by a plurality of chips. In FIG. 11, each of the chips D0–D7 represents the SDRAM according to the present invention. Each chip has the DM terminal of the present invention. In addition, a command, a clock signal and the like are sent to each chip through bus lines. In the figure, CS represents "chip select".

By using the memory chip shown in FIG. 10 or the memory module shown in FIG. 11 as the memory module in FIG. 1, the time margin is improved, and a memory system which can operate at high speed can be provided. The memory system can take various configurations. For example, a memory board can be realized by providing the memory module, the controller and the clock source on a board.

As mentioned above, according to the present invention, the DQS, DQ and DM terminals are configured such that the capacity and other characteristics are the same. Therefore, the timing margin is improved, and it becomes possible to provide a semiconductor device which can operate at higher speed.

The present invention is not limited to the specifically disclosed embodiments, and variations and modifications may be made without departing from the scope of the invention.

What is claimed is:

1. A semiconductor device which includes a first terminal for inputting and outputting data and a second terminal for inputting control data in synchronization with a strobe signal, said semiconductor device comprising:

a first circuit for outputting data which is provided in said first terminal; and a second circuit provided in said second terminal, wherein a value of a terminal capacitance of said first circuit is identical to a value of a terminal capacitance of said second circuit.

2. A semiconductor device which includes an input/output terminal for inputting and outputting data and a data mask terminal for inputting a mask signal in synchronization with a strobe signal, said semiconductor device comprising:

a first circuit for outputting data which is provided in said input/output terminal; and a second circuit provided in said data mask terminal, wherein a value of a terminal capacitance of said first circuit is identical to a value of a terminal capacitance of said second circuit.

3. The semiconductor device as claimed in claim 1, wherein said first circuit comprises a first transistor, and said second circuit comprises a second transistor.

4. The semiconductor device as claimed in claim 2, wherein said first circuit comprises a first transistor, and said second circuit comprises a second transistor.

5. The semiconductor device as claimed in claim 1, wherein said first circuit comprises a first PMOS transistor and a first NMOS transistor, and wherein said second circuit comprises a second PMOS transistor and a second NMOS transistor; and wherein a first gate of said second PMOS transistor is connected to a source terminal, and a second gate of said second NMOS transistor is connected to a ground terminal.

6. The semiconductor device as claimed in claim 1, further comprising:

a first junction area provided in said first circuit; and a second junction area provided in said second circuit, wherein said first junction area is the same as the second junction area.

7. The semiconductor device as claimed in claim 2, further comprising:

a first junction area provided in said first circuit; and a second junction area provided in said second circuit, wherein said first junction area is the same as the second junction area.

8. The semiconductor device as claimed in claim 3, wherein a source voltage of said first transistor is the same as that of said second transistor.

* * * * *